United States Patent
Richardson et al.

(10) Patent No.: US 6,306,684 B1
(45) Date of Patent: Oct. 23, 2001

(54) STRESS REDUCING LEAD-FRAME FOR PLASTIC ENCAPSULATION

(75) Inventors: David Richardson, Chandler; Joseph Fernandez, Gilbert; Dan Termer, Phoenix, all of AZ (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 09/527,298

(22) Filed: Mar. 16, 2000

(Under 37 CFR 1.47)

(51) Int. Cl.⁷ .................................................. H01L 21/50
(52) U.S. Cl. ........................... 438/118; 438/138; 438/200; 438/256; 156/153; 257/676; 436/615
(58) Field of Search ..................................... 438/118, 200, 438/256, 138; 257/676; 156/153; 436/615

(56) References Cited

U.S. PATENT DOCUMENTS

| | | | |
|---|---|---|---|
| 4,388,132 | * 6/1983 | Hoge et al. | 156/153 |
| 4,942,452 | * 7/1990 | Kitano et al. | 357/68 |
| 5,397,915 | 3/1995 | Nose | 257/676 |
| 5,773,878 | * 6/1998 | Lim et al. | 257/676 |
| 5,818,103 | 10/1998 | Harada | 257/676 |
| 5,872,398 | 2/1999 | King et al. | 257/735 |
| 5,885,892 | * 3/1999 | Kondo | 436/615 |

\* cited by examiner

Primary Examiner—Vu A. Le
Assistant Examiner—Pho Luy
(74) Attorney, Agent, or Firm—Baker Botts L.L.P.

(57) ABSTRACT

A method for attaching an integrated circuit die to a mounting structure, the method having the steps of: forming a mounting structure having a die pad and at least one spreader; applying an adhesive to the die pad and the at least one spreader of the mounting structure; and attaching the integrated circuit die to the adhesive, wherein the at least one spreader is between the die pad and the integrated circuit die. Also, an integrated circuit package having: a mounting structure having a die pad and at least one spreader; an adhesive adhered to the die pad and the at least one spreader of the mounting structure; and an integrated circuit die adhered to the adhesive, wherein the at least one spreader is between the die pad and the integrated circuit die. Finally, a mounting structure for an integrated circuit die, the mounting structure comprising: a die pad for supporting the integrated circuit die; and at least one spreader for supporting the integrated circuit die at a distance from the die pad.

32 Claims, 9 Drawing Sheets

STRESS REDUCING LEAD-FRAME FOR PLASTIC ENCAPSULATION

BACKGROUND OF THE INVENTION

1. Field of the Invention

The present invention relates to semiconductor devices. In particular, the invention relates to a lead-frame design for integrated circuit packaging to reduce chip stress and deformation and to improve mold filling.

2. Description of Prior Art

The current state of the art for plastic packaged integrated circuits describes an integrated circuit die coupled to a lead frame mounting structure by epoxy, glue or other types of adhesive material. The integrated circuit die and mounting structure are subsequently encapsulated in plastic material, typically through a transfer molding process.

The problem, noticed in the Joint Electron Device Engineering Council (JEDEC) semiconductor package identified as Thin Shrink Small Outline Package (TSSOP), but applicable to virtually all types of plastic encapsulation of integrated circuits, is cracking or fracturing of the integrated circuit die when subject to thermal stress. Thermal stress can, and often does occur, at temperatures above 25 degrees Centigrade. Under test and/or operating conditions, the thermal coefficient of expansion of the mounting structure and the die are not identical. Further, once the device is encapsulated in plastic, the thermal coefficient of expansion of the mounting structure is greater than that of the plastic encapsulant. Under expansion conditions, the plastic encapsulant induces competing and opposite forces on the integrated circuit die. For example, as the temperature increases, either by ambient variation or by operating heat dissipation, the plastic package tends to expand. This expansion induces forces in the integrated circuit die. These forces from the plastic package tend to inhibit the expansion of the die because there are expansion forces from the die itself which are opposite in direction to those of the plastic package. Also, there are expansion forces from the mounting structure which cause a frictional migratory effect on the interface between the die and the die paddle. Above 25 degrees Centigrade, expansion forces occur at two key interfaces as a result of thermal stress: 1) the integrated circuit die and plastic package interface, and 2) the integrated circuit die and mounting structure interface.

The result of these expansion forces typically appears initially as cracks on the bottom of the integrated circuit die, i.e., the surface of the integrated circuit die which interfaces with mounting structure. The cracks or fractures may then propagate throughout the die. Under lower stress conditions, the cracks may be observed on the bottom surface of the integrated circuit die as hairline fractures. These hairline fractures typically result in partial loss of function of the integrated circuit. In extreme cases, the cracks may have propagated throughout the entire thickness of the integrated circuit die to the extent of complete fissure of the die, resulting in loss of function and total failure of the integrated circuit.

Since integrated circuit chip failures due to cracking from thermal expansion is a recognized problem in the industry, the prior art has identified a need to reduce chip stress by redesigning the lead-frame and bonding interface between the chip and lead-frame. With reference to FIGS. 1A and 1B, one solution proposed in the prior art is to form grooves 5 or holes 6 in the lead frame or mounting structure 11. With the groove 5, the lead frame has a dual plane mounting surface, wherein the top plane 7 is the more substantial plane of the mounting surface. The bottom plane 8 is found at the bottom of the groove 5 and is relatively much smaller in area than the top plane 7.

The grooves 5 and holes 6 act as expansion joints to relieve stress as the lead frame 11 and die 10 expand and contract relative to each other. With the groove 5 cut in the surface of the lead frame adjacent the integrated circuit die, the thickness of the adhesive between the bottom of the groove 5 and the die is greater than the thickness of the adhesive between the adjacent surface of the lead frame and the die. This additional thickness relieves stress between the two structures in the vicinity of the groove 5. The holes 6 provide a similar effect.

For example, in U.S. Pat. No. 5,773,878, incorporated herein by reference, a lead-frame having a split die pad is disclosed. The die pad is split into several sections which are joined together by flexible expansion joints. A split die pad allows relative motion between the pad and the chip during die attached cure. The split also breaks down the total die pad area (and length) that is rigidly attached to the chip and to smaller sections. The smaller total die pad area and length reduce the magnitude of the coefficient of thermal expansion between the chip and the die pad, which prevents deformation of the assembly.

An alternative design for a lead-frame or semiconductor element mounting diepad is disclosed in U.S. Pat. No. 5,397,915, incorporated herein by reference. In this reference, a plurality of slits and dimples are disposed on a flat surface of a semiconductor element mounting diepad. The slits penetrate from the face to the back side of the semiconductor element mounting diepad. The slits are formed by punching or chemical etching methods. Slits of the same shape are formed at an interval of the width of the dimples. The rear side is pushed out by press means to form dimples with the boundary of the slits. Thus, the slits are formed in one body at both ends of the dimples. By forming grooves or dimples in the semiconductor element mounting diepad, the contact area with the sealing resin is widened.

In U.S. Pat. No. 5,818,103, incorporated herein by reference, a semiconductor device is described which has a semiconductor chip mounted on the mounting portion of a lead-frame and sealed with a resin. The lead-frame has a groove formed in the lead-frame in a cruciform, radial, lattice or similar pattern capable of reducing thermal stress during intermittent performance test and cycling test while ensuring heat radiation.

In all of the embodiments described in the prior art, the more significant portion of the lead-frame mounting diepad is in contact with the semiconductor chip. If the thermal coefficient of expansion of the mounting structure and the die are not identical, competing and opposite forces are induced in the integrated circuit die sufficient to crack the die. For example, as temperature increases, either by ambient variation or by operating heat dissipation, the mounting structure will expand or contract at a different rate than the integrated circuit die in the plane of the integrated circuit die. While the prior art recognizes a need to relieve this stress, it teaches that significant portions of the mounting structure must remain in contact with the integrated circuit die. Thus, significant localized stress is experienced by the integrated circuit chip.

Therefore, there is a need for a mounting structure or lead-frame design which reduces stress induced by thermal expansion across the entire integrated circuit die as well as local portions of the integrated circuit die.

SUMMARY OF THE INVENTION

The present invention is an alternative design for a lead-frame mounting structure which minimizes the contact area between the lead frame mounting structure and the integrated circuit die. It is now believed that die cracks propagate from silicon defects, like stacking faults, which are found in an integrated circuit die. These defects are found in small areas of the die and have different coefficients of thermal expansion. These small areas are the primary cause of die cracking. The present invention is a lead frame design which allows forces induced by thermal expansion to be spread over larger areas of the die between points of contact with the lead frame. By increasing the distance between points of contact, the force per unit area associated with the defect is reduced and maintained at a level below the fracture point. Since the contact areas between the mounting structure and the die are minimized, the die is free to expand and contract without restriction by the lead frame or the die attach medium. With the present invention, the expansion forces are maintained within the silicon instead of being transferred to the mounting structure.

The present invention accommodates integrated circuit dies having defects located anywhere within the dies, since the stress is relieved across the whole of the dies. The invention is highly advantageous because defects are unpredictably found in various locations on integrated circuit dies. In the prior art, cracks are prevented from propagating only from those defects in the integrated circuit chips that are located very near or directly over stress relieving elements (groove, hole, dimple, etc.) in the lead frame support structure. The lead frames of the present invention are designed so that defects in the integrated circuit die are prevented from being a source of cracks no matter where the defects are located in the integrated circuit dies.

In the present invention, the integrated circuit die is also attached to a pre-stressed portion of the lead-frame (being the top of a dimpled mound) due to the bending which prevents lateral expansion of the lead-frame. The elimination of the lead-frame expansion leaves only the minimal silicon expansion as a force in the silicon and greatly lowers the overall induced force. The lead-frame expansion is now in an orthogonal direction, relative to the plane of the integrated circuit die, and does not induce additional stresses in the die.

According to one aspect of the invention, there is provided a method for attaching an integrated circuit die to a mounting structure, the method having the steps of: forming a mounting structure having a die pad and at least one spreader; applying an adhesive to the die pad and the at least one spreader of the mounting structure; and attaching the integrated circuit die to the adhesive, wherein the at least one spreader is between the die pad and the integrated circuit die.

According to a further aspect of the invention, there is provided an integrated circuit package having: a mounting structure having a die pad and at least one spreader; an adhesive adhered to the die pad and the at least one spreader of the mounting structure; and an integrated circuit die adhered to the adhesive, wherein the at least one spreader is between the die pad and the integrated circuit die.

According to still another aspect of the invention, there is provided a mounting structure for an integrated circuit die, the mounting structure comprising: a die pad for supporting the integrated circuit die; and at least one spreader for supporting the integrated circuit die at a distance from the die pad.

BRIEF DESCRIPTION OF THE DRAWINGS

The present invention is better understood by reading the following description of non-limitative embodiments with reference to the attached drawings wherein like parts in each of the several figures are identified by the same reference characters, and which are briefly described as follows.

It is to be noted, however, that the appended drawings illustrate only typical embodiments of this invention and are therefore not to be considered limiting of its scope, as the invention may admit to other equally effective embodiments.

DETAILED DESCRIPTION OF THE INVENTION

Figure 1A:
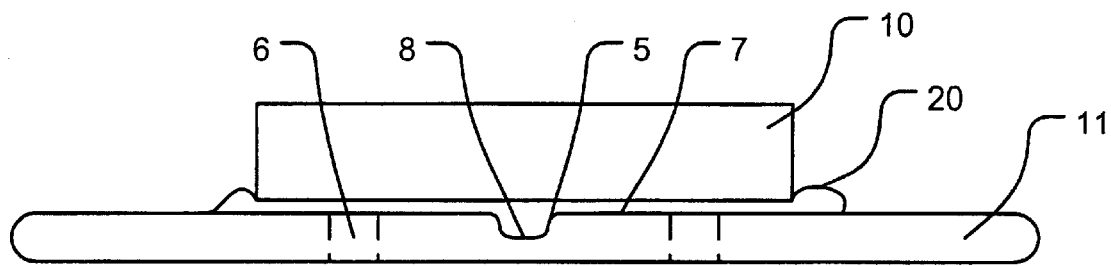
FIG. 1A is a side view of a prior art lead-frame mounting structure with an attached integrated circuit die. The lead-frame has holes and a groove.
Figure 1B:
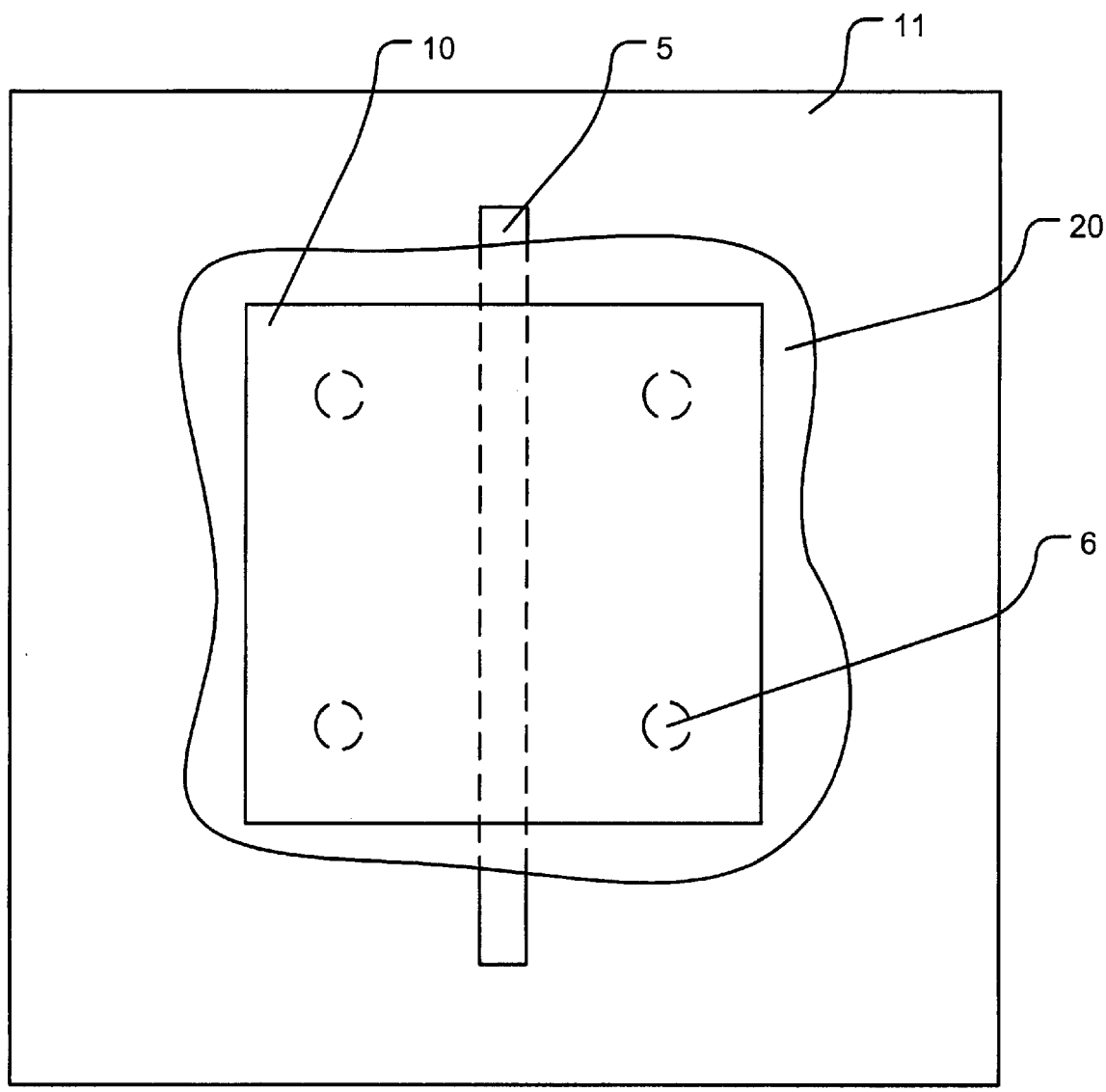
FIG. 1B is a top view of the prior art lead-frame and attached die shown in FIG. 1A.
Figure 2A:
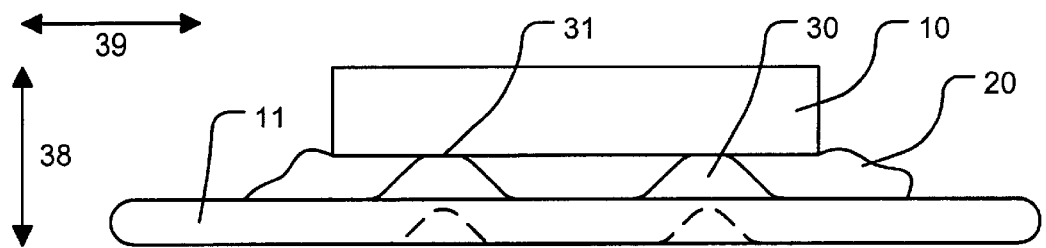
FIG. 2A is a side view of an embodiment of the invention when the lead-frame has dimples which are pressed from a back side of the lead-frame and the die is attached to the raised portions of the dimples.
Figure 2B:
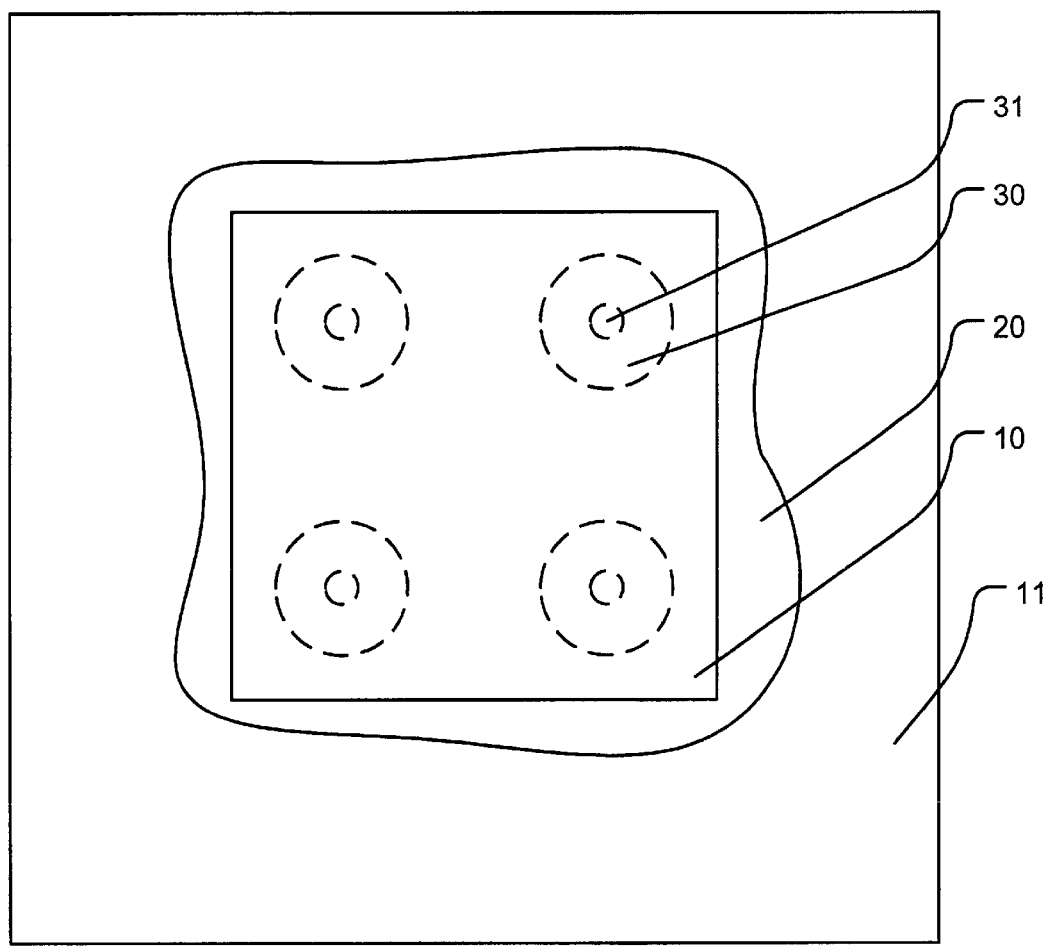
FIG. 2B is a top view of the lead-frame mounting structure and attached die shown in FIG. 2A.

Referring to FIGS. 2A and 2B, side and top views of an embodiment of the invention are shown, respectively. In this embodiment, the mounting structure is a lead frame 11 and the spreaders are dimples 30. An integrated circuit die 10 is attached to the lead-frame 11 by die attach adhesive 20. The lead-frame 11 has four dimples 30. Each dimple 30 is a circular dimple having a top 31. The integrated circuit die 10 rests on the top 31 of each dimple 30. The die attach adhesive 20 is disposed between the integrated circuit die 10 and the lead-frame 11 and is interposed about the dimples 30. In this particular embodiment, the integrated circuit die 10 is square and the dimples 30 are located in the lead-frame 11 so as to be positioned under the four corners of the integrated circuit die 10.

While the lead frame 11 supports the integrated circuit die 10 indirectly through the adhesive 20, the integrated circuit die 10 is supported directly by the spreaders, which in this case are dimples 30. Of course, a thin layer of adhesive 20 is also found between the tops 31 of the dimples 30 and the integrated circuit die 10, but this layer is typically so thin it is negligible when considering the effect of the lead frame on the die during thermal expansion. The surface area of the dimples 30 are relatively small, even when added together, compared to the surface area of the remaining portion of the lead frame directly under the integrated circuit die 10. Thus, only a small portion of the mounting structure (dimples 30) are in direct contact with the integrated circuit die 10.

During thermal expansion, the integrated circuit die 10 and lead frame 11 expand and contract at different rates. Since a majority of the material comprising the lead-frame 11 is aligned in the horizontal direction 39, most of the dimensional changes of the lead-frame 11 are in the horizontal direction 39. The material comprising the dimples 30 expands partially in the vertical direction 38. Expansion in the vertical direction 38 only increases the separation distance of the lead frame 11 and the die 10 and does not induce stress in the die 10. Further, since the die is separated from the lead frame 1, the expansion of the lead frame in the horizontal direction 39 is absorbed by the die attach material 20. Therefore, this configuration significantly reduces the amount of stress induced in the die 10 due to thermal expansion.

Figure 3A:
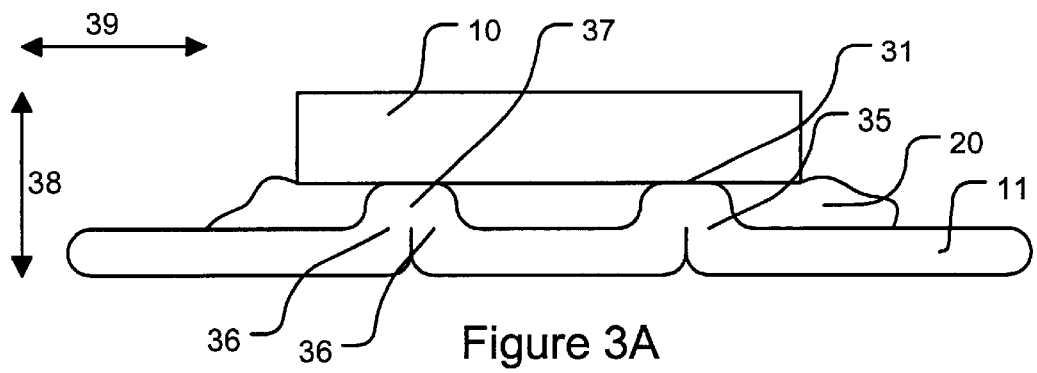
FIG. 3A is a side view of an embodiment of the invention wherein a lead-frame has folds or bent portions which produce ridges across the lead-frame. The integrated circuit die is attached to the raised portions of the ridges.
Figure 3B:
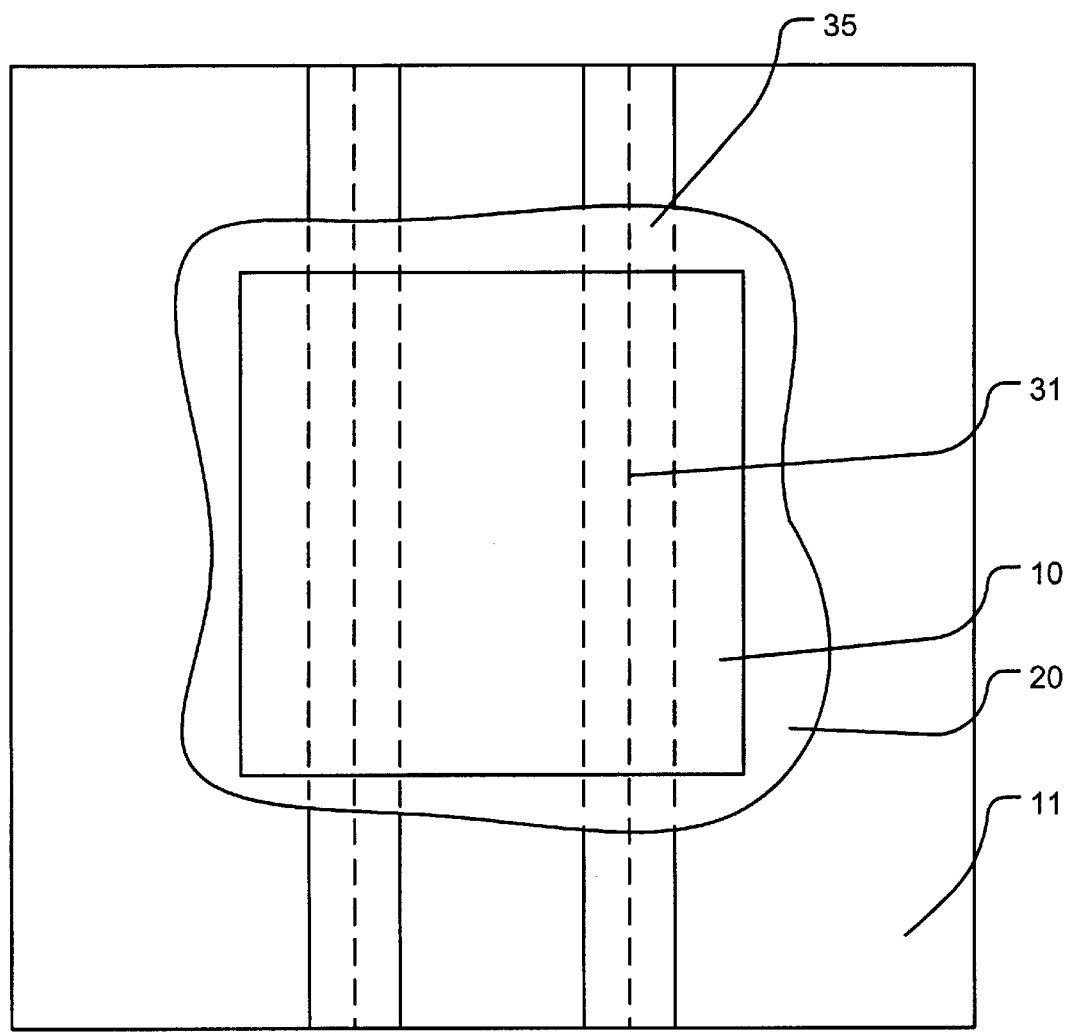
FIG. 3B is a top view of the lead-frame and attached die shown in FIG. 3A.

Referring to FIGS. 3A and 3B, side and top views of an embodiment of the invention are shown, respectively. In this embodiment, the mounting structure is a lead frame 11 and the spreaders are ridges 35. The lead-frame 11 is angled or bent to form ridges 35. As shown, the ridges 35 extend across the entire length of the integrated circuit die 10. Further, in this embodiment, two ridges 35 are formed parallel to each other. Each ridge 35 has a top 31 to which the integrated circuit die 10 is attached. As in the previous embodiment, the integrated circuit die 10 is attached to the lead-frame 11 by die attach adhesive 20.

Each ridge 35 has a pair of vertical portions 36 which are joined by horizontal portion 37. Of course, the horizontal portion forms the top 31 upon which the integrated circuit die 10 is attached. As noted above, the lead-frame 11 expands and contracts with changes in temperature according to its coefficient of thermal expansion. Since a majority of the material comprising the lead-frame 11 is aligned in the horizontal direction 39, most of the dimensional changes of the lead-frame 11 are in the horizontal direction 39. Further, since the integrated circuit die 10 is attached only to the tops 31 of the ridges 35, the integrated circuit die 10 is not significantly impacted by the thermal expansion of the lead-frame 11. Finally, thermal expansion of the vertical portions 36 of the ridges 35 only increases the distance between the integrated circuit die 10 and the lead-frame 11. Therefore, thermal expansion of the vertical portions 36 in the vertical direction 38 has no deleterious effect on the integrated circuit die 10.

Figure 4A:
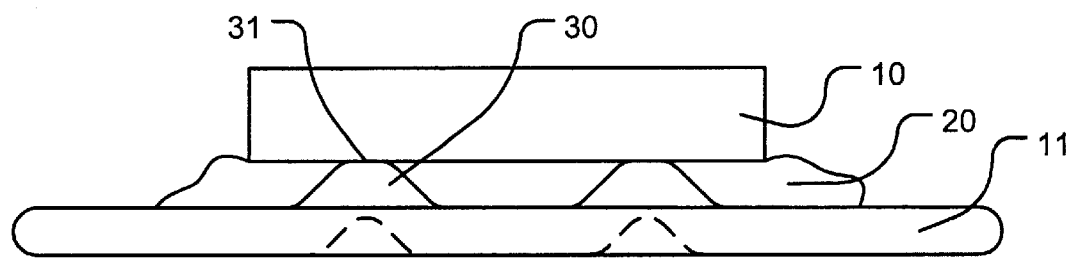
FIG. 4A is a side view of an embodiment of the invention wherein the lead-frame has elongated dimples wherein the die is attached to the raised portions of the dimples.
Figure 4B:
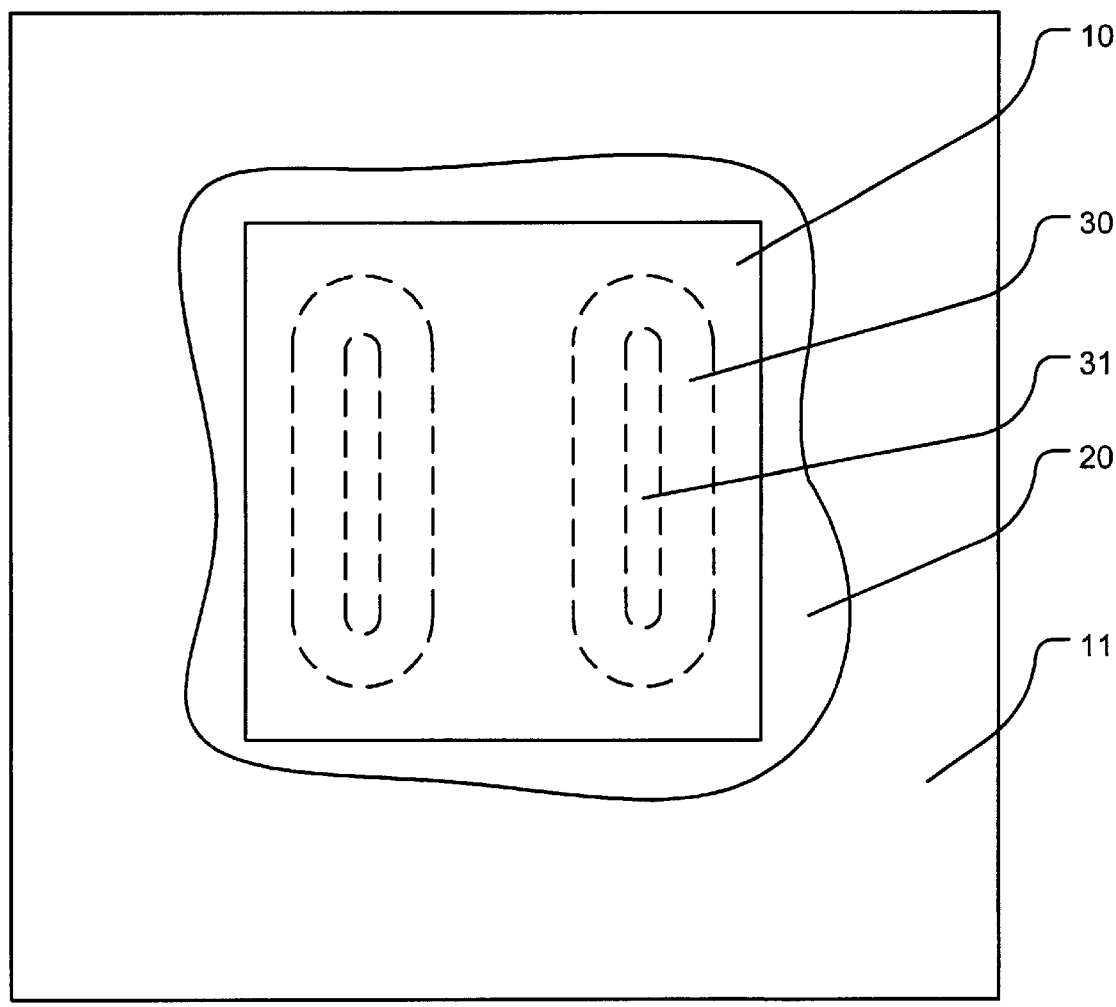
FIG. 4B is a top view of the lead-frame and attached die shown in FIG. 4A.

Referring to FIGS. 4A and 4B, side and top views of an embodiment of the invention are shown, respectively. In this embodiment, the mounting structure is a lead frame 11 and spreaders are dimples 30. Two dimples 30 are formed in the lead-frame 11 and are symmetrically positioned under the integrated circuit die 10. The dimples 30 are linear in form and are positioned parallel to each other. As before, the integrated circuit die 10 is attached to the tops 31 of the dimples 30. The die attach adhesive 20 is between and around the dimples 30 so as to attach the integrated circuit die 10 to the lead-frame 11.

Figure 5A:
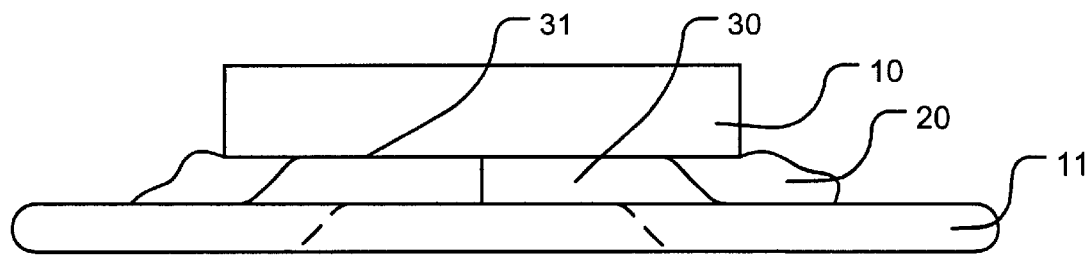
FIG. 5A is a side view of an embodiment of the invention wherein the lead-frame has an X-shaped dimple and the integrated circuit die is attached to the raised portion of the dimple.
Figure 5B:
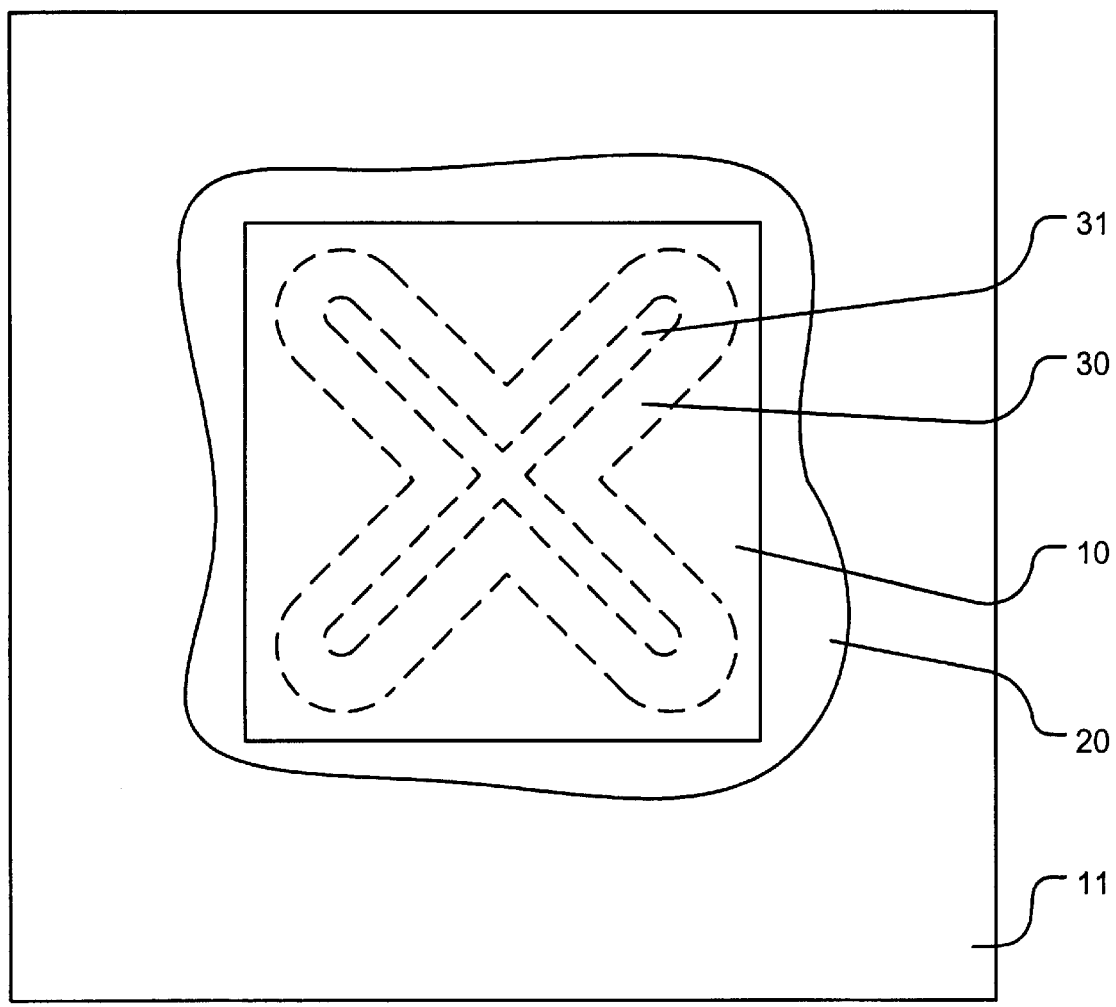
FIG. 5B is a top view of the lead-frame mounting structure and attached die shown in FIG. 5A.

Referring to FIGS. 5A and 5B, side and top views of an embodiment of the invention are shown, respectively. In this embodiment, the mounting structure is a lead frame 11 and spreader is a dimple 30. A single dimple 30 is formed in the lead-frame 11. The dimple 30 has the shape of an "X." The distal portions of the "X" are positioned beneath each of the four corners of the integrated circuit die 10, respectively. As before, the dimple 30 has a top 31 upon which the integrated circuit die 10 is attached. The die attach adhesive 20 is between the lead-frame 11 and the integrated circuit die 10 and surrounds the dimple 30.

Figure 6A:
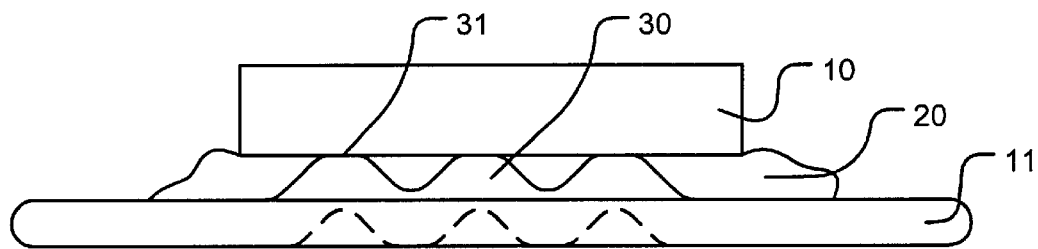
FIG. 6A is a side view of an embodiment of the invention wherein the lead-frame has four circular shaped dimples and the integrated circuit die is attached to the raised portions of the dimples.
Figure 6B:
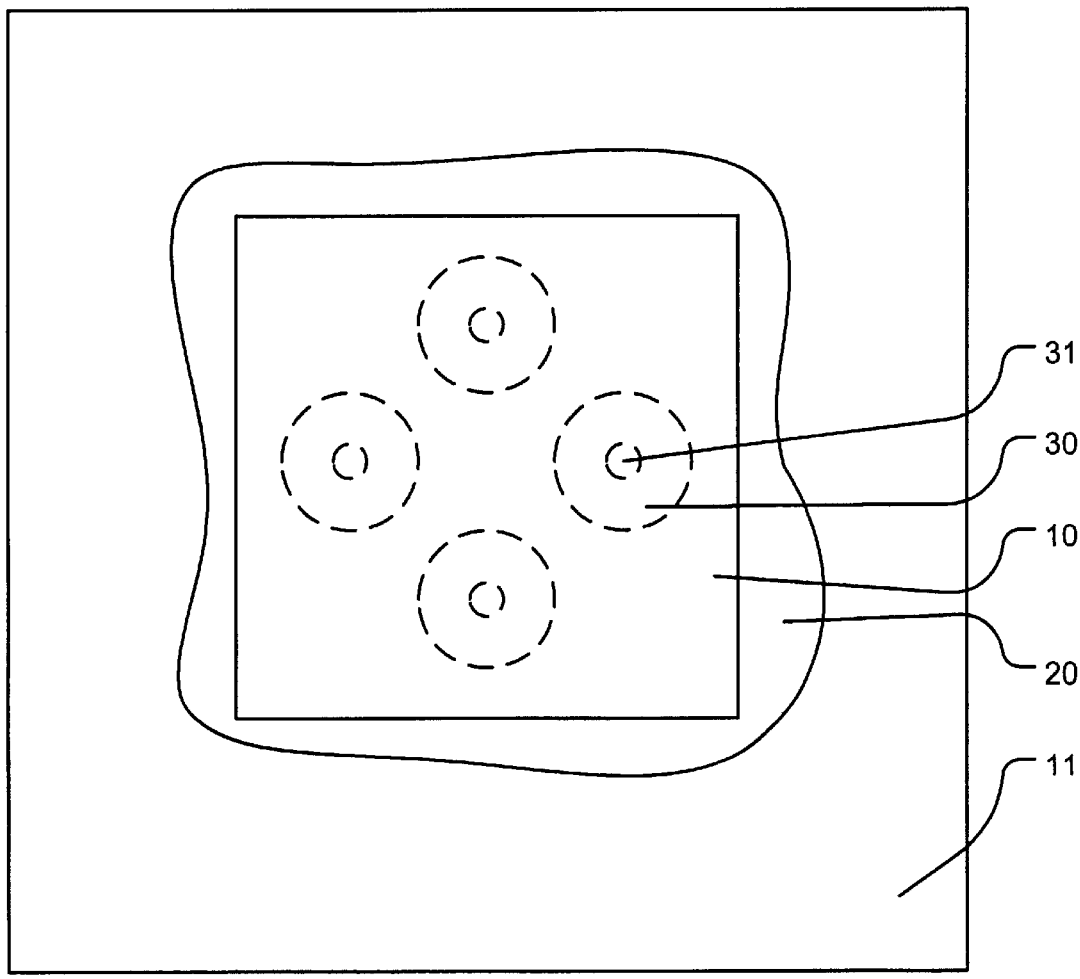
FIG. 6B is a top view of the lead-frame mounting structure and attached die shown in FIG. 6A.

Referring to FIGS. 6A and 6B, side and top views of an embodiment of the invention are shown, respectively. In this embodiment, the mounting structure is a lead frame 11 and spreaders are dimples 30. Four dimples 30 are formed in the lead-frame 11. The dimples 30 are positioned beneath the sides at the midpoint between the corners of the integrated circuit die 10. The integrated circuit die 10 is attached to the tops 31 of the dimples 30 by the die attach adhesive 20 which is between the integrated circuit die 10 and the lead-frame 11.

Figure 7A:
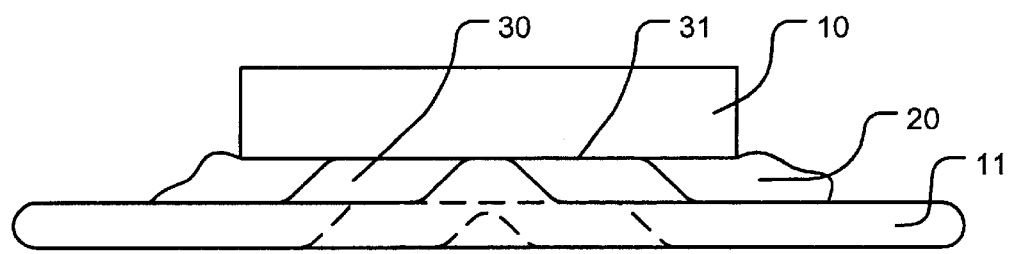
FIG. 7A is a side view of an embodiment of the invention having an X-shaped dimple wherein the integrated circuit die is attached to the raised portion of the dimple.
Figure 7B:
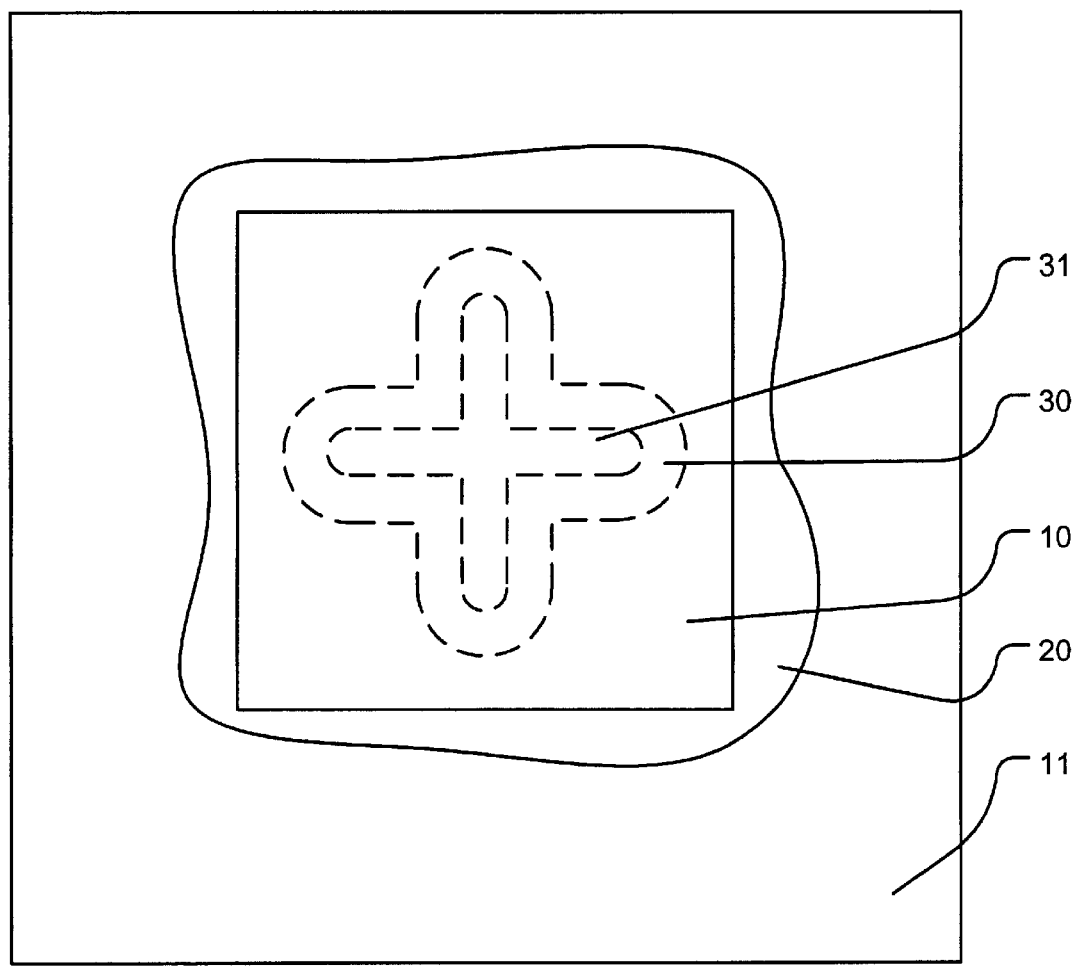
FIG. 7B is a top view of the lead-frame and attached die shown in FIG. 7A.

Referring to FIGS. 7A and 7B, side and top views of an embodiment of the invention are shown, respectively. In this embodiment, the mounting structure is a lead frame 11 and the spreader is a dimple 30. A single dimple 30 is formed in the lead-frame 11.

The dimple 30 has the shape of a "T." The distal ends of the dimple 30 are positioned beneath the sides, at the midpoint between the corners, of the integrated circuit die 10. The integrated circuit die 10 is attached to the top 31 of the dimple 30 by the die attach adhesive 20.

Figure 8A:
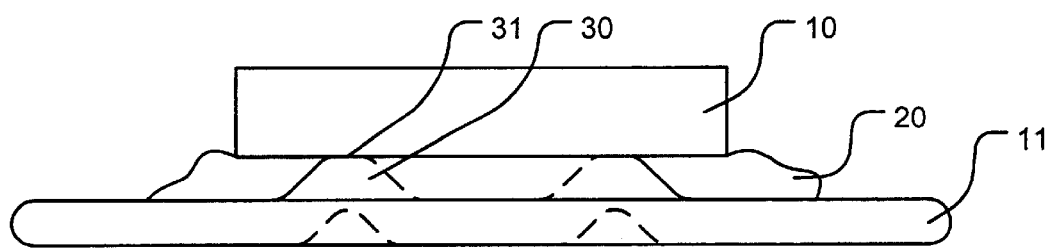
FIG. 8A is a side view of an embodiment of the invention wherein the lead-frame has a circular dimple and the integrated circuit die is attached to a raised portion of the dimple.
Figure 8B:
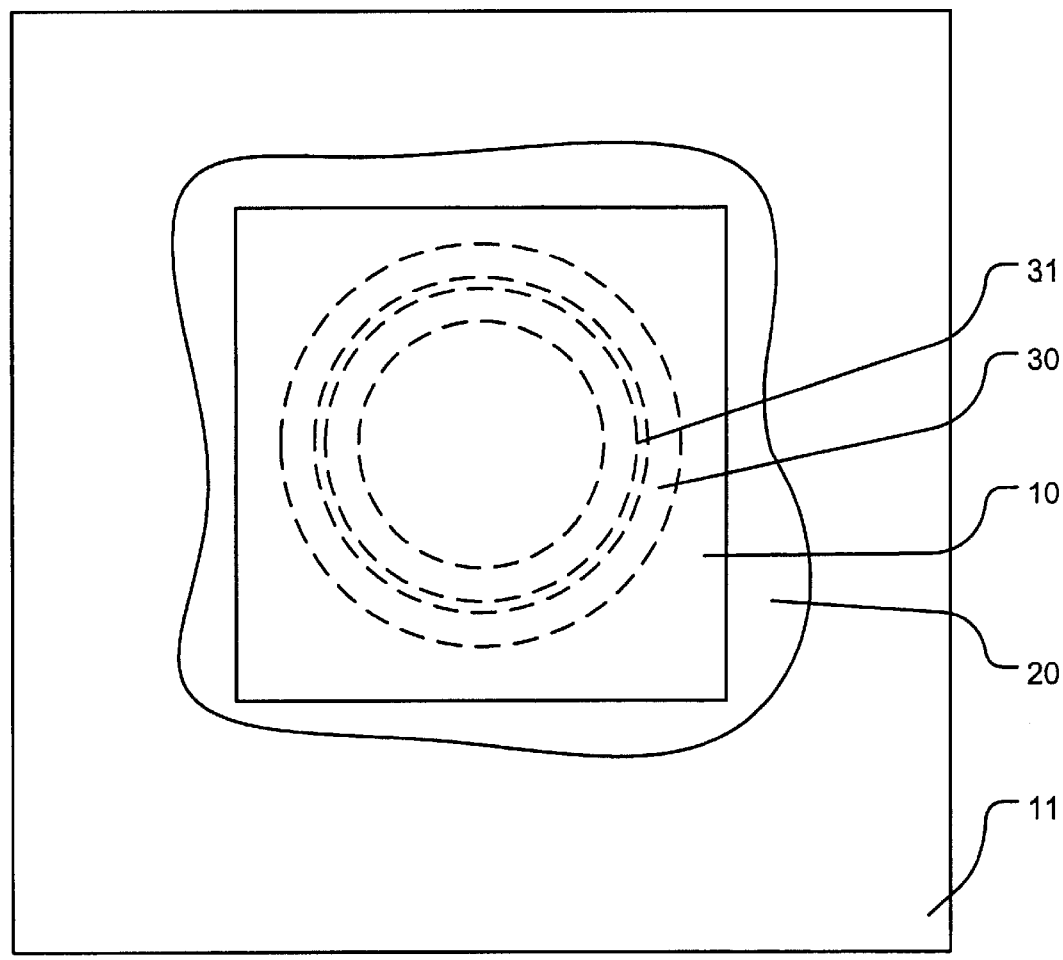
FIG. 8B is a top view of the lead-frame and attached die shown in FIG. 8A.

Referring to FIGS. 8A and 8B, side and top views of an embodiment of the invention are shown, respectively. In this embodiment, the mounting structure is a lead frame 11 and the spreader is a dimple 30. A single dimple 30 is formed in the lead-frame 11. The dimple 30 is formed in the shape of a ring and is centrally located beneath the integrated circuit die 10. The integrated circuit die 10 is attached to a top 31 of the dimple 30 by the die attach adhesive 20. The die attach adhesive 20 is both on the inside and the outside of the circular dimple 30.

Figure 9A:
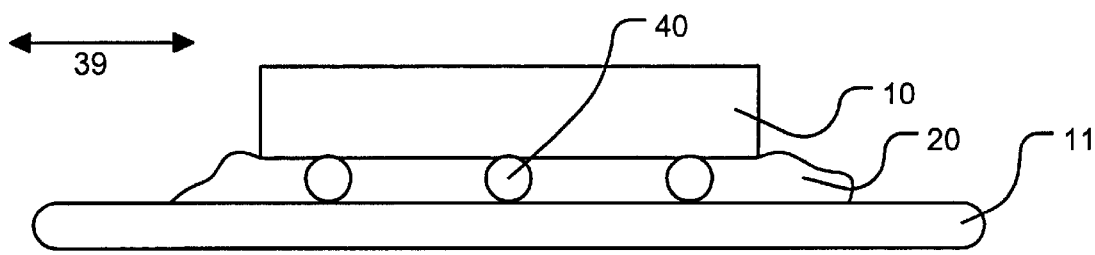
FIG. 9A is a side view of an embodiment of the invention having inserts or spacers between the lead-frame mounting structure and the attached die wherein the inserts or spacers are between the lead-frame and the die.
Figure 9B:
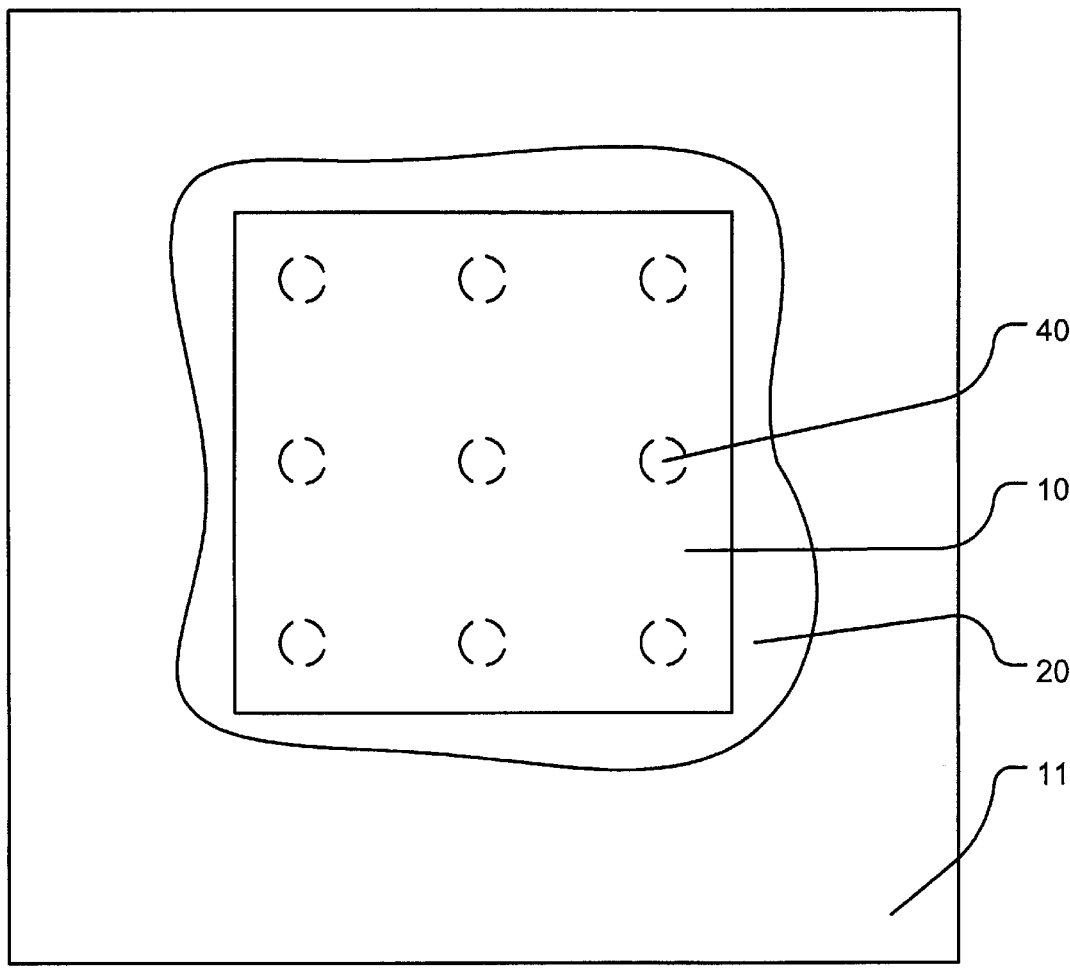
FIG. 9B is a top view of the lead-frame and attached die shown in FIG. 9A.

Referring to FIGS. 9A and 9B, side and top views of an embodiment of the invention are shown, respectively. In this embodiment, the mounting structure is a lead frame 11 and the spreaders are spacers 40. The spacers 40 are positioned between the integrated circuit die 10 and the lead-frame 11. In the embodiment shown, nine spacers 40 are positioned equidistant from each other symmetrically between the integrated circuit die 10 and the lead-frame 11. The integrated circuit die 10 is attached to the lead-frame 11 by die attach adhesive 20 with the spacers 40 between. Spacers 40 ensure that the integrated circuit die 10 is held at a constant distance from the lead-frame 11. Further, as the lead-frame 11 expands and contracts due to thermal expansion in the horizontal direction 39, minimal force is transferred from the lead-frame 11 through the spacers 40 to the integrated circuit die 10. Only a minimal force is exerted on the integrated circuit die 10 because the spacers 40 move and shift slightly with the changes and dimension due to thermal expansion.

In the embodiment of the invention shown in FIGS. 9A and 9B, the spacers 40 are balls. In alternative embodiments, the spacers are blocks, cylinders, wires, washers, disks, or any other geometric form known to persons of skill in the art. The purpose of the spacers is to support the integrated circuit die 10 on the lead-frame 11 through minimal contact so that the integrated circuit die is attached by a relatively thick portion of die attach adhesive 20 across a significant portion of the area between the integrated circuit die 10 and the lead-frame 11. The spacers 40 support the die 10 and ensure that the separation distance between the die 10 and the lead frame 11 is uniform across the entire area.

While the particular embodiments for integrated circuit die lead-frame mounting structures as herein shown and disclosed in detail are fully capable of obtaining the objects and advantages herein before stated, it is to be understood that they are merely illustrative of the preferred embodiments of the invention and that no limitations are intended by the details of construction or design herein shown other than as described in the appended claims.

What is claimed is:

1. A method for attaching an integrated circuit die to a mounting structure, the method comprising:

forming a mounting structure having a die pad and at least one spreader;

applying an adhesive to the die pad and the at least one spreader of said mounting structure; and attaching the integrated circuit die to the adhesive, wherein the at least one spreader is between the die pad and the integrated circuit die, and whereby an area of the integrated circuit die in contact with the at least one spreader is less than an area not in contact with the at least one spreader.

2. A method as claimed in claim 1, wherein said at least one spreader is a dimple, and wherein said forming a mounting structure comprises pressing a dimple in the die from a side opposite a side of the die pad to which the integrated circuit die is to be attached.

3. A method as claimed in claim 1, wherein said at least one spreader is a rib, and wherein said forming a mounting structure comprises bending a rib in the die pad.

4. A method as claimed in claim 1, wherein said at least one spreader is a spacer, and wherein said forming a mounting structure comprises placing the spacer between the die pad and the integrated circuit die.

5. A method as claimed in claim 4, wherein said spacer is a ball.

6. A method as claimed in claim 4, wherein said spacer is a wire.

7. A method as claimed in claim 4, wherein said spacer is a block.

8. A method as claimed in claim 4, wherein said spacer is a cylinder.

9. A method as claimed in claim 4, wherein said spacer is a washer.

10. A method as claimed in claim 4, wherein said spacer is a disk.

11. A method as claimed in claim 1, further comprising encapsulating the integrated circuit die, the adhesive and the mounting structure in plastic.

12. An integrated circuit package comprising:

a mounting structure having a die pad and at least one spreader;

an adhesive adhered to the die pad and the at least one spreader of said mounting structure; and an integrated circuit die adhered to the adhesive, wherein the at least one spreader is between the die pad and the integrated circuit die, and whereby an area of the integrated circuit die in contact with the at least one spreader is less than an area not in contact with the at least one spreader.

13. A package as claimed in claim 12, wherein said at least one spreader is a dimple, and wherein said dimple protrudes from a side of the die pad to which the integrated circuit die is adhered.

14. A package as claimed in claim 12, wherein said at least one spreader is a rib, and wherein said rib is bent in the die pad and protrudes from a side of the die pad to which the integrated circuit die is adhered.

15. A package as claimed in claim 12, wherein said at least one spreader is a spacer placed between the die pad and the integrated circuit die.

16. A package as claimed in claim 15, wherein said spacer is a ball.

17. A package as claimed in claim 15, wherein said spacer is a wire.

18. A package as claimed in claim 15, wherein said spacer is a block.

19. A package as claimed in claim 15, wherein said spacer is a cylinder.

20. A package as claimed in claim 15, wherein said spacer is a washer.

21. A package as claimed in claim 15, wherein said spacer is a disk.

22. A package as claimed in claim 12, further comprising plastic which encapsulates the integrated circuit die, the adhesive and the mounting structure.

23. A mounting structure for an integrated circuit die, said mounting structure comprising:

a die pad for supporting the integrated circuit die; and at least one spreader for supporting the integrated circuit die at a distance from said die pad, wherein an area of the die pad for supporting the integrated circuit die is greater than an area of the at least one spreader for supporting the integrated circuit die at a distance from said die pad.

24. A mounting structure as claimed in claim 23, wherein said at least one spender is a dimple, and wherein said dimple protrudes from a side of the die pad to which the integrated circuit die is to be adhered.

25. A mounting structure as claimed in claim 23, wherein said at least one spender is a rib, and wherein said rib is bent in the die pad and protrudes from a side of the die pad to which the integrated circuit die is to be adhered.

26. A mounting structure as claimed in claim 23, wherein said at least one spreader is a spacer adjacent the die on a side of the die pad to which the integrated circuit die is to be adhered.

27. A mounting structure as claimed in claim 26, wherein said spacer is a ball.

28. A mounting structure as claimed in claim 26, wherein said spacer is a wire.

29. A mounting structure as claimed in claim 26, wherein said spacer is a block.

30. A mounting structure as claimed in claim 26, wherein said spacer is a cylinder.

31. A mounting structure as claimed in claim 26, wherein said spacer is a washer.

32. A mounting structure as claimed in claim 26, wherein said spacer is a disk.

* * * * *